United States Patent
Hotate et al.

(10) Patent No.: US 9,195,141 B2
(45) Date of Patent: Nov. 24, 2015

(54) PLATE SURFACE PROTECTING LIQUID COMPOSITION FOR LITHOGRAPHIC PRINTING PLATE USING SAME

(71) Applicants: Shoichi Hotate, Kounosu (JP); Maru Aburano, Gunma-ken (JP)

(72) Inventors: Shoichi Hotate, Kounosu (JP); Maru Aburano, Gunma-ken (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/360,681

(22) PCT Filed: Dec. 4, 2012

(86) PCT No.: PCT/JP2012/081376
§ 371 (c)(1),
(2) Date: May 27, 2014

(87) PCT Pub. No.: WO2013/084882
PCT Pub. Date: Jun. 13, 2013

(65) Prior Publication Data
US 2014/0370443 A1 Dec. 18, 2014

(30) Foreign Application Priority Data
Dec. 5, 2011 (JP) .................. 2011-266146

(51) Int. Cl.
G03F 7/26 (2006.01)
G03F 7/40 (2006.01)
B41N 3/08 (2006.01)
G03F 7/20 (2006.01)

(52) U.S. Cl.
CPC .. G03F 7/40 (2013.01); B41N 3/08 (2013.01); G03F 7/2002 (2013.01)

(58) Field of Classification Search
CPC ........................................................ G03F 7/26
USPC ........................................................ 430/302
See application file for complete search history.

(56) References Cited

U.S. PATENT DOCUMENTS 8,323,874 B2 12/2012 Ray et al.
2011/0155009 A1* 6/2011 Strehmel et al. .............. 101/453

FOREIGN PATENT DOCUMENTS

| JP | 62-234993 | | 10/1987 |
|---|---|---|---|
| JP | 62-234993 A | * | 10/1987 |
| JP | 02-003066 | | 1/1990 |
| JP | 02-048996 | | 2/1990 |
| JP | 02-48996 | * | 2/1990 |
| JP | 08-171211 | | 7/1996 |
| JP | 11-288106 | | 10/1999 |
| JP | 2004-243600 | | 9/2004 |

* cited by examiner

Primary Examiner — Chanceity Robinson
(74) Attorney, Agent, or Firm — J. Lanny Tucker

(57) ABSTRACT

It is an object of the present invention to provide a plate surface protecting liquid composition which enables an improvement in adhesion of a printing ink onto a lithographic printing plate at the beginning of printing, and to provide a method for treating a lithographic printing plate using the plate surface protecting liquid composition, which can reduce the generation of waste paper immediately after the beginning of printing. Disclosed is a plate surface protecting liquid composition for lithographic printing plate, including a polysiloxane compound having a polyether chain in the side-chain.

12 Claims, No Drawings

PLATE SURFACE PROTECTING LIQUID COMPOSITION FOR LITHOGRAPHIC PRINTING PLATE USING SAME

TECHNICAL FIELD

The present invention relates to a plate surface protecting liquid composition for lithographic printing plate, and also relates to a method for treating a lithographic printing plate, using the plate surface protecting liquid composition.

BACKGROUND ART

Technology of lithographic printing is based on immiscibility of oil and water. An oily material or a printing ink is preferentially received by an image area, and water or dampening solution is preferentially received by a non-image area. When a surface of a lithographic printing plate is wetted with water and then a printing ink is adhered, a background or a non-image area receives water and repels a printing ink, whereas, an image area receives a printing ink and repels water. Subsequently, the printing ink in the image area is transferred to an image-formed surface of materials such as papers, plastics and cloths through a roll.

In general, a lithographic printing plate precursor (the term "printing plate precursor" as used herein means a printing plate before imagewise exposure and development) and usually includes a photosensitive coating film applied on a substrate including aluminum as a base material. The coating film responds to light under exposure and the exposed area becomes soluble so that it is removed during development. Such printing plate precursor is called "positive-working". Conversely, when exposed area of the coating film is cured by light so that it remains as the image area after development. Such printing plate precursor is called "negative-working". Usually, the area, which is more soluble than the other areas of the coating film, is removed by using a strong alkali developer. The remaining image area receives the printing ink and is lipophilic, while the non-image area (background) receives water and is hydrophilic.

Usually, the lithographic printing plate precursor is developed by an automatic development processor after exposure. In the finishing step (or gum section) after development treatment, a plate surface protecting liquid (also referred to as a desensitizing liquid or a protective gum liquid) is applied on a printing surface of the printing plate with an image formed thereon. Application of the plate surface protecting liquid on the entire printing surface enables keeping of hydrophilicity of a support surface of the non-image area, and prevention of contamination of the printing surface due to adhesion of fingerprints, oils and fats, dusts, and the like during storage until use in a printing press after plate making, and during handling when mounted in the printing press, leading to further enhancement in scratch-resistant strength.

The lithographic printing plate thus finish-treated is mounted to a printing press and, after test printing called an operation of printing in the beginning, a normal printing operation is performed. The operation of printing in the beginning is usually performed until a printed matter with sufficient density can be obtained, and several tens to several hundreds of sheets are printed. The fewer the number of sheets used for test printing at the beginning of printing, more earlier a normal printing operation can be started, leading to saving of needless printing paper.

Japanese Translation of PCT International Application Publication No. 2008-511031 discloses a method for a post treatment of a lithographic printing plate, in which the lithographic printing plate is brought into contact with a solution containing at least one phosphono-substituted siloxane, so as to increase adhesion of an image area to a substrate and to prevent toning when a printing press is restarted.

Japanese Unexamined Patent Publication (Kokai) No. 2009-83106 discloses a plate surface protecting agent for lithographic printing plate using a compound having a specific ethylene oxide skeleton, which is excellent in the effect of preventing fingerprint smudge of the lithographic printing plate after plate making.

Japanese Unexamined Patent Publication (Kokai) No. 2004-243531 discloses a plate surface protecting agent comprising a polyalkylene oxide compound including a specific aromatic ring structure, which is excellent in the effect of preventing scratching and stains of a lithographic printing plate and the effect of protecting hydrophilicity of the non-image area, and also imparts satisfactory inking property to an ink in the printing process.

Japanese Unexamined Patent Publication (Kokai) No. 2000-89476 discloses a plate surface protecting agent comprising a polyalkylene oxide compound having a specific structure, which enables desensitization of the non-image area of a lithographic printing plate, and also causes no print omitting even when stored over the long period, leading to high stability.

CITATION LIST

Patent Literature

[Patent Literature 1]
Japanese Translation of PCT International Application Publication No. 2008-511031
[Patent Literature 2]
Japanese Unexamined Patent Publication (Kokai) No. 2009-83106
[Patent Literature 3]
Japanese Unexamined Patent Publication (Kokai) No. 2004-243531
[Patent Literature 4]
Japanese Unexamined Patent Publication (Kokai) No. 2000-89476

SUMMARY OF INVENTION

Technical Problem

One of problems in printing using a lithographic printing plate is waste paper which generates until a normal printed matter is obtained from the beginning of printing. The reason of an increase in waste paper has hitherto been considered to be poor inking, stains of the non-image area, and the like.

The present inventors have intensively studied and found that use of a plate surface protecting liquid composition containing a polysiloxane compound having a polyether chain in the side-chain in a finishing treatment of a lithographic printing plate enables achievement in effect of improving inking property in the image area without impairing print smear resistance in the non-image area.

It is an object of the present invention to provide a plate surface protecting liquid composition which enables an improvement in adhesion of a printing ink onto a lithographic printing plate at the beginning of printing, and to provide a method for treating a lithographic printing plate using the plate surface protecting liquid composition, which can reduce the generation of waste paper immediately after the beginning of printing.

Solution to Problem

The present invention is directed to a plate surface protecting liquid composition for lithographic printing plate, including a polysiloxane compound having a polyether chain in the side-chain.

The present invention is also directed to a method for treating a lithographic printing plate, which includes the steps of: imagewise exposing a lithographic printing plate precursor; developing the imagewise exposed lithographic printing plate precursor with an alkali developer; and treating the developed lithographic printing plate with the above-mentioned plate surface protecting liquid composition.

DESCRIPTION OF EMBODIMENTS

Plate surface protecting Liquid Composition

The plate surface protecting liquid composition for lithographic printing plate of the present invention is characterized by including a polysiloxane compound having a polyether chain in the side-chain.

The polysiloxane compound having a polyether chain in the side-chain usable in the present invention is represented by the following formula (1):

[Chemical Formula 1]

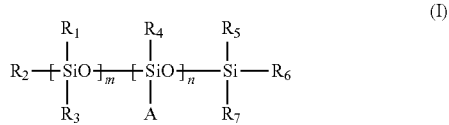

wherein $R_1$, $R_2$, $R_3$, $R_4$, $R_5$, $R_6$ and $R_7$ each independently H or an alkyl group having 1 to 20 carbon atoms, A is represented by $-R-(C_2H_4O)_a(C_3H_6O)_b-R'$, and m and n are integers of 1 to 1,200.

$R_1$, $R_2$, $R_3$, $R_4$, $R_5$, $R_6$ and $R_7$ can be alkyl groups having 1 to 20 carbon atoms, and may be either linear or branched. Preferable alkyl group is an alkyl group having 1 to 10 carbon atoms. Particularly preferable alkyl group is selected from the group consisting of a methyl group, an ethyl group, a propyl group and a butyl group. $R_1$ to $R_7$ may be further substituted with a substituent.

The feature of the present invention is that polysiloxane is polyether-modified with a pendant group represented by A: $-R-(C_2H_4O)_a(C_3H_6O)_b-R'$, wherein R is an alkylene having 1 to 20 carbon atoms or an arylene having 6 to 14 carbon atoms, and R' is H or an alkyl group having 1 to 10 carbon atoms. The numeral "a" of the oxyethylene group moiety is from 0 to 200, and the numeral "b" of the oxypropylene group moiety is from 0 to 200. However, a and b are not simultaneously 0. Preferably, a and b are from 0 to 100.

In the above formula, m and n are integers of 1 to 1,200. "n" is the number of polyether-modified unit in a polysiloxane compound according to the present invention. Preferably, m is from 1 to 1,050 and n is from 1 to 200.

The polysiloxane compound having a polyether chain in the side-chain represented by the formula (1) of the present invention is synthesized by a hydrosilylation reaction of a silicon atom-bonded hydrogen atom-containing organohydrogen polysiloxane with a polyoxyalkylene having a terminal double bond. The organohydrogen polysiloxane may contain at least one silicon atom-bonded hydrogen atom in a molecule, and a constituent siloxane unit thereof is represented by the general formula: $R^1{}_aSiO_{4-a)/2}$, wherein $R^1$ is a hydrogen atom, or a substituted or unsubstituted monovalent hydrocarbon group. Specific examples of the monovalent hydrocarbon group include saturated aliphatic hydrocarbon groups such as a methyl group, an ethyl group, a propyl group, a butyl group, a pentyl group, a hexyl group, a heptyl group, an octyl group, a decyl group and a dodecyl group; saturated alicyclic hydrocarbon groups such as a cyclopentyl group and a cyclohexyl group; aromatic hydrocarbon groups such as a phenyl group, a tolyl group and a naphthyl group; or groups in which hydrogen atoms bonded to the carbon atom of these groups are partially substituted with a halogen atom, or an organic group including an epoxy group, a carboxyl group, an amino group, a methacrylic group or a mercapto group, and they may be the same or different. Of these groups, an alkyl group is preferable, and a methyl group is more preferable. At least one of $R^1$ in the molecule is a hydrogen atom. "a" meets the impression: $0<a\leq 3$ on average. The molecular structure of such organohydrogen polysiloxane is not limited and is, for example, linear, partially branched linear, branched, cyclic or dendritic, and preferably linear.

The polyoxyalkylene having a terminal double bond includes a compound represented by the general formula: $R^3O(R^4O)_aR^3$, wherein $R^3$ is a hydrogen atom or a monovalent hydrocarbon group, at least one of which is an alkenyl group having a terminal double bond, such as a vinyl group, an allyl group, a 3-butenyl group or a hexenyl group. Examples of the other monovalent hydrocarbon group include saturated aliphatic hydrocarbon groups such as a methyl group, an ethyl group, a propyl group, a butyl group, a pentyl group, a hexyl group, a heptyl group, an octyl group, a decyl group and a dodecyl group; saturated alicyclic hydrocarbon groups such as a cyclopentyl group and a cyclohexyl group; aromatic hydrocarbon groups such as a phenyl group, a tolyl group and a naphthyl group; or groups in which hydrogen atoms bonded to the carbon atom of these groups are partially substituted with a halogen atom, or an organic group including an epoxy group, a carboxyl group or a methacrylic group. $R^3$ may be the same or different. $R^4$ is a substituted or unsubstituted divalent hydrocarbon group and includes, for example, an ethylene group, a propylene group, a butylene group, a pentylene group, a phenylene group and an alkyl-substituted phenylene group. Examples of the catalyst used in a hydrosilylation reaction include chloroplatinic acid, alcohol-modified chloroplatinic acid, an olefin complex of chloroplatinic acid, a complex of chloroplatinic acid and β-diketones, a complex of chloroplatinic acid and vinylsiloxane, a catalyst obtained by supporting fine particle-shaped platinum on powders of alumina or silica, platinum black, a palladium catalyst and a rhodium catalyst. Of these catalysts, a platinum-based catalyst is preferable. The amount of the catalyst to be added is a catalyst quantity and is not particularly limited, and the amount of metallic platinum is preferably from 0.1 to 1.000 ppm (weight), and more preferably from 0.5 to 100 ppm (weight), based on the total amount of the above-mentioned organohydrogen polysiloxane and polyoxyalkylene. The hydrosilylation reaction proceeds without using a solvent, but an organic solvent may also be used.

Examples of the organic solvent to be used include alcohol-based solvents such as ethanol and isopropyl alcohol; aromatic hydrocarbon-based solvents such as toluene and xylene; ether-based solvents such as dioxane and THF; aliphatic hydrocarbon-based solvents; ester-based solvents; ketone-based solvents; and chlorinated hydrocarbon-based solvents. The reaction temperature is usually from 50 to 150° C.

The amount (% by mass) of the polysiloxane compound having a polyether chain in the side-chain represented by the formula (1) can be from 0.1 to 2.0% by mass based on the total mass of the plate surface protecting liquid composition of the present invention. It is not preferred that the amount is 0.1% by mass or less since an improvement in ink adhesion cannot be achieved. Also it is not preferred that the amount is 2.0% by mass or more since a siloxane compound is separated in a plate surface protecting liquid. The amount is particularly preferably within a range from 0.4 to 1.0% by mass.

It is preferred to further add a water-soluble polymer compound having film-forming property to the plate surface protecting liquid composition of the present invention. Examples of the water-soluble polymer compound include acasia, cellulose derivatives (for example, carboxymethyl cellulose, carboxyethyl cellulose, methyl cellulose, hydroxypropyl cellulose, etc.) and modified compounds thereof, polyvinyl alcohol and derivatives thereof, polyvinylpyrrolidone, polyacrylamide and copolymers thereof, vinyl methyl ether/maleic anhydride copolymer, vinyl acetate/maleic anhydride copolymer, styrene/maleic anhydride copolymer, water-soluble soybean polysaccharides, starch derivative (for example, dextrin, enzymatically hydrolyzed dextrin, hydroxypropylated starch enzymatically hydrolyzed dextrin, carboxymethylated starch, phosphorylated starch, cyclodextrin), pullulan and pullulan derivative, and hemicellulose extracted from soybean. The content of these water-soluble polymers is preferably from 0.1 to 30% by mass, and particularly preferably from 1 to 20% by mass, based on the total mass of the plate surface protecting liquid composition.

The plate surface protecting liquid composition of the present invention may contain a surfactant. Preferable surfactants are a nonionic surfactant and an anionic surfactant.

Examples of the nonionic surfactant include polyoxyethylene alkyl ethers, polyoxyethylene alkyl phenyl ethers, polyoxyethylene polystyryl phenyl ether, polyoxyethylene polyoxypropylene alkyl ether, glycerin fatty acid partial esters, sorbitan fatty acid partial esters, pentaerythritol fatty acid partial esters, propylene glycol monofatty acid ester, sucrose fatty acid partial ester, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylenealkylamine, Triethanolamine fatty acid ester, trialkylamine oxide, polypropylene glycol having a molecular weight of 200 to 5,000, trimethylolpropane, adduct of polyoxyethylene or polyoxypropylene of glycerin or sorbitol, and acetylene glycol-based surfactants.

The anionic surfactant is useful for improving inking property or coater coatability. Examples of specific compound of the anionic surfactant usable in the present invention include fatty acid salts, abietic acid salts, hydroxyalkanesulfonic acid salts, alkanesulfonic acid salts, dialkylsulfosuccinic acid salts, linear alkylbenzenesulfonic acid salts, branched alkylbenzenesulfonic acid salts, alkylnaphthalenesulfonic acid salts, alkylphenoxypolyoxyethylenepropylsulfonic acid salts, polyoxyethylene alkyl sulfophenyl ether salts, sodium N-methyl-N-oleyltaurine, N-alkylsulfosuccinic acid monoamide disodium salts, petroleum sulfonic acid salts, sulfated castor oil, sulfated beef tallow, sulfuric acid ester salts of fatty acid alkyl ester, alkylsulfuric acid ester salts, polyoxyethylene alkyl ether sulfuric acid ester salts, fatty acid monoglyceride sulfuric acid ester salts, polyoxyethylene alkyl phenyl ethersulfuric acid ester salts, polyoxyethylene styryl phenyl ether sulfuric acid ester salts, alkylphosphoric acid ester salts, polyoxyethylene alkyl ether phosphoric acid ester salts, polyoxyethylene alkyl phenyl ether phosphoric acid ester salts, partially saponified styrene-maleic anhydride copolymers, partially saponified olefin-maleic anhydride copolymers, naphthalenesulfonic acid salt formalin condensates, and the like. Two or more kinds of these surfactants can be used in combination. The amount of the surfactant to be used is preferably from 0.01 to 20% by mass, and particularly preferably from 0.1 to 10% by mass, based on the total mass of the plate surface protecting composition. Examples of the cationic surfactant include quaternary ammonium salts trimethylbenzylammonium chloride.

In order to improve inking property of the image area, an organic solvent may be further added to the plate surface protecting liquid composition of the present invention. Examples of such solvent include alcohols, ketones, esters, and polyhydric alcohols.

Examples of alcohols include n-hexanol, 2-ethylbutanol, n-heptanol, 2-heptanal, 3-heptanol, 2-octanol, 2-ethylhexanol, 3,5,5-trimethylhexanol, nonanol, n-decanol, undecanol, n-dodecanol, tetradecanol, heptadecanol, trimethylnonyl alcohol, cyclohexanol, benzyl alcohol, tetrahydrofurfuryl alcohol, and the like.

Examples of ketones include methyl n-amyl ketone, methyl n-hexyl ketone, ethyl n-butyl ketone, di-n-propyl ketone, diacetone alcohol, cyclohexanone, and the like.

Examples of esters include n-amyl acetate, isoamyl acetate, methylisoamyl acetate, methoxybutyl acetate, benzyl acetate, ethyl lactate, butyl lactate, n-amyl lactate, methyl benzoate, ethyl benzoate, dimethyl phthalate, diethyl phthalate, dibutyl phthalate, di-2-ethylhexyl phthalate, dioctyl phthalate, and the like.

Examples of polyhydric alcohols and derivatives thereof include ethylene glycol, ethylene glycol monomethyl ether acetate, ethylene glycol monoethyl ether acetate, ethylene glycol butyl ether, ethylene glycol dibutyl ether, ethylene glycol isoamyl ether, ethylene glycol monophenyl ether, ethylene glycol monophenyl ether acetate, ethylene glycol benzyl ether, ethylene glycol monohexyl ether, methoxyethanol, diethylene glycol, diethylene glycol monomethyl ether, diethylene glycol monoethyl ether, diethylene glycol monobutyl ether, diethylene glycol monobutyl ether acetate, diethylene glycol dimethyl ether, diethylene glycol diethyl ether, diethylene glycol dibutyl ether, triethylene glycol, triethylene glycol monomethyl ether, triethylene glycol monoethyl ether, tetraethylene glycol, polyethylene glycol, propylene glycol, dipropylene glycol, propylene glycol monoethyl ether, propylene glycol monobutyl ether, 1-butoxyethoxypropanol, dipropylene glycol, dipropylene glycol monomethyl ether, dipropylene glycol monoethyl ether, tripropylene glycol monomethyl ether, tripropylene glycol monobutyl ether, octylene glycol, 2-ethyl-1,3-hexanediol, 1,6-hexanediol, 2,5-hexanediol, 3,4-hexanediol, 1,8-octanediol, 1,9-nonanediol, 1,10-decanediol, glycerin, glycerin monoacetate, glycerin triacetates, sorbitol, and the like.

For the purpose of pH adjustment and hydrophilization, an acid may be added. Examples of the mineral acid include phosphoric acid, nitric acid, sulfuric acid, and the like. Examples of the organic acid include citric acid, acetic acid, oxalic acid, phosphonic acid, malonic acid, p-toluenesulfonic acid, tartaric acid, malic acid, lactic acid, levulinic acid, phytic acid, tannic acid, and the like. Examples of the inorganic salt include magnesium nitrate, nickel sulfate, and the like. Mineral acids, organic acids or inorganic salts may be used alone, or two or more kinds of them may be used in combination. The addition amount is preferably from 0.1 to 10% by mass based on the total mass of the plate surface protecting liquid composition.

In addition to the components mentioned above, a chelating agent may be optionally added. Usually, the plate surface protecting liquid composition is commercially available in the form of a concentrated solution and is diluted by adding city water or well water before use. Since calcium ions contained in city water or well water used for dilution may exert an adverse influence on printing and thus print matters are easily stained, the above problems can be solved by adding the chelating compound.

Examples of such chelating agent include acids such as ethylenediaminetetraacetic acid, diethylenetriaminepentaacetic acid, triethyleneaminehexaacetic acid, hydroxyethylethylenediaminetriacetic acid, nitrilotriacetic acid, 1-hydroxyethane-1,1-diphosphonic acid, aminotri(methylenephosphonic acid), ethylenediaminetetra(methylenephosphonic acid), diethylenetriaminepenta(methylenephosphonic acid), triethylenetetraminhexa(methylenephosphonic acid) and hydroxyethylethylenediaminetri(methylenephosphonic acid), and potassium, sodium and amine salts thereof. These chelating agents are selected from those which stably exist in the composition of the plate surface protecting liquid composition and do not inhibit printability. The addition amount is preferably from 0.01 to 10% by mass based on the total mass of the plate surface protective agent when used.

In addition, additives such as an antiseptic and a defoamer may be added to the plate surface protecting liquid composition of the present invention. Examples of the antiseptic include phenol or derivatives thereof, formalin, phenolformalin, imidazole derivatives, sodium dehydroacetate, 4-isothiazolin-3-one derivatives, benzointhiazolin-3-one, benztriazole derivatives, amidineguanidine derivatives, quaternary ammonium salts, derivatives of pyridine, quinoline and guanidine, dieazine, triazole derivatives, oxazole, oxazine derivatives, nitroalcohol derivatives, and benzoic acid or derivatives thereof. Preferable addition amount is the amount which stably exerts the effect against bacteria, molds and yeasts and varies depending on the kinds of bacteria, molds and yeasts, and is preferably within a range from 0.001 to 1% by mass based on the total mass of the plate surface protecting composition. Two or more kinds of antiseptics are preferably used in combination so as to exert the effect against molds and bacteria. The defoamer is preferably a silicone defoamer. Of these deformers, any of emulsion/dispersion type and solubilized deformers can be used. The addition amount is preferably from 0.001 to 1% by mass based on the total mass of the plate surface protecting composition. After treating with the plate surface protecting composition, the lithographic printing plate is dried and used for printing as a printing plate.

A description will be made on a lithographic printing plate precursor capable of treating using a plate surface protecting liquid composition of the present invention. The plate surface protecting liquid composition of the present invention can be used in all types of lithographic printing plate precursors, that is, both of a printing plate produced from a positive-working precursor and a printing plate produced from a negative-working precursor. These printing plate precursors can be ultraviolet light- or visible light-sensitive (i.e. having sensitivity to radiation selected from a wavelength ranging from 320 to 750 nm), or IR-sensitive (i.e. having sensitivity to radiation selected from a wavelength ranging from 750 nm to 1,600 nm, and preferably from 750 nm to 1,350 nm), or heat-sensitive. The plate surface protecting liquid composition of the present invention can be used to either a single-layered precursor or a precursor having a multi-layered structure.

The plate surface protecting liquid composition of the present invention is capable of effectively treating both of a lithographic printing plate produced from a positive-working lithographic printing plate precursor and a lithographic printing plate produced from a negative-working lithographic printing plate precursor. A typical positive-working lithographic printing plate precursor will be described below. It will be obvious to those skilled in the art that the lithographic printing plate precursor, which can be treated using the plate surface protecting liquid composition of the present invention, is not limited thereto.

<Substrate>

Examples of the substrate include metal plates such as aluminum, zinc, copper, stainless steel and iron plates; composite substrates coated with aluminum; plastic films such as polyethylene terephthalate, polycarbonate, polyvinyl acetal and polyethylene films; composite materials obtained by vacuum-depositing or laminating a metal layer on papers or plastic films on which a synthetic resin is melt-coated or a synthetic resin solution is coated; and materials used as the substrate of the printing plate. Of these substrates, aluminum and composite substrates coated with aluminum are preferably used.

The surface of the aluminum substrate is preferably subjected to a surface treatment for the purpose of enhancing water retention and improving adhesion with the bottom layer or the intermediate layer formed optionally. Examples of the surface treatment include surface roughening treatments such as brush graining, ball graining, electrolytic etching, chemical etching, liquid honing, sand blasting, and a combination thereof. Of these surface treatments, a surface roughening treatment including the use of electrolytic etching is preferable.

As the electrolytic bath used in the electrolytic etching, an aqueous solution containing acid, alkali or a salt thereof, or an aqueous solution containing an organic solvent is used. Of these, an electrolytic solution containing hydrochloric acid, nitric acid, or a salt thereof is preferable.

The aluminum plate subjected to the surface roughening treatment is subjected to desmutting using an aqueous solution of an acid or alkali, if necessary. The aluminum substrate thus obtained is preferably subjected to an anodizing treatment. An anodizing treatment of treating using a bath containing sulfuric acid or phosphoric acid is particularly preferable.

<Intermediate Layer>

In order to further enhance adhesion of the image recording layer to a substrate or to enhance hydrophilicity of a substrate surface, it is possible to include an intermediate layer between the substrate and the image recording layer. For example, it is possible to perform a silicate treatment (sodium silicate, potassium silicate), a treatment with a polymer having a phosphonic acid group or a phophoric acid group, a potassium fluorozirconate treatment, a phosphomolybdate treatment, an alkyl titanate treatment, a polyacrylic acid treatment, a phytic acid treatment, a treatment with a salt of hydrophilic organic polymer compound and divalent metal, a condensed arylsulfonic acid salt treatment, a hydrophilization treatment by undercoating with a water soluble polymer having an sulfonic acid group, a coloring treatment with an acidic dye, an electrodeposition with silicate, and the like.

An aluminum support subjected to a sealing treatment after subjecting to the anodizing treatment is also preferable. The sealing treatment can be performed by dipping an aluminum support in hot water or a hot water solution containing an inorganic or organic salt, or a steam bath.

<Image Recording Layer>

The image recording layer constituting a lithographic printing plate precursor usable in the present invention can be a single layer, or also can be a two-layer type composed of a first image recording layer and a second image recording layer formed thereon. The image recording layer can be a layer including a positive-working photosensitive composition or a negative-working photosensitive composition.

It is preferred to use, as the positive-working photosensitive composition, the following conventionally known positive-working photosensitive compositions [(a) to (d)]:

(a) a conventional positive-working photosensitive composition including quinonediazide and a novolak resin, which has conventionally been used;

(b) an infrared photosensitive positive-working composition containing a resin and a photothermal conversion agent, which are soluble or dispersible in a water-insoluble and alkali aqueous solution, a solubility in the alkali aqueous solution increasing by an action of heat;

(c) an infrared-sensitive positive-working composition including a heat-degradable sulfonic acid ester polymer or an acid-degradable carboxylic acid ester polymer, and an infrared absorber; and (d) a chemically amplified positive-working photosensitive composition including a combination of an alkali-soluble compound protected with an acid-degradable group, and an acid generator.

It is possible to use, as the negative-working photosensitive composition, the following conventionally known negative-working photosensitive compositions ((g) to (j)):

(g) a negative-working photosensitive composition including a polymer having a photocrosslinkable group, and an azide compound;

(h) a negative-working photosensitive composition including a diazo compound;

(i) a photo- or heat-polymerizable negative-working photosensitive composition including a photo- or heat-polymerization initiator, an addition polymerizable unsaturated compound and an alkali-soluble polymer compound; and (j) a negative-working photosensitive composition including an alkali-soluble polymer compound, an acid generator and an acid-crosslinkable compound.

When using the plate surface protecting composition of the present invention, an infrared-sensitive positive-working lithographic printing plate precursor including a layer including an infrared-sensitive positive-working composition is preferable. An infrared-sensitive positive-working lithographic printing plate precursor including a first image recording layer and a second image recording layer is more preferable.

<First Image Recording Layer>

The first image recording layer constituting the lithographic printing plate precursor contains a resin which is soluble or dispersible in an alkali aqueous solution.

Since the resin is soluble or dispersible in an alkali aqueous solution, the resin preferably has at least a functional group such as a hydroxyl group, a carboxyl group, a sulfonic acid group, a phosphoric acid group, an imide group or an amide group. Therefore, it is possible to preferably produce the resin, which is soluble or dispersible in an alkali aqueous solution, by polymerizing a monomer mixture containing one or more ethylenically unsaturated monomers having a functional group such as a hydroxyl group, a carboxyl group, a sulfonic acid group, a phosphoric acid group, an imide group, an amide group, or a combination thereof.

The ethylenically unsaturated monomer can be a compound represented by the following formula:

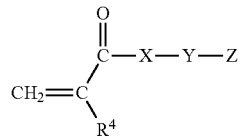

[Chemical Formula 2]

wherein $R^4$ is a hydrogen atom, a $C_{1-22}$ linear, branched or cyclic alkyl group, a $C_{1-22}$ linear, branched or cyclic substituted alkyl group or a $C_{6-24}$ aryl group or substituted aryl group, and the substituent is selected from a $C_{1-4}$ alkyl group, an aryl group, a halogen atom, a keto group, an ester group, an alkoxy group or a cyano group; X is O, S or $NR^5$, and $R^5$ is hydrogen, a $C_{1-22}$ linear, branched or cyclic alkyl group, a $C_{1-22}$ linear, branched or cyclic substituted alkyl group or a $C_{6-24}$ aryl group or substituted aryl group, and the substituent is selected from a $C_{1-4}$ alkyl group, an aryl group, a halogen atom, a keto group, an ester group, an alkoxy group or a cyano group; Y is a single bond, or a $C_{1-22}$ linear, branched or cyclic alkylene, alkyleneoxyalkylene, a poly(alkyleneoxy)alkylene or an alkylene-NHCONH—; and Z is a hydrogen atom, a hydroxy group, carboxylic acid, —$C_6H_4$—$SO_2NH_2$, —$C_6H_3$—$SO_2NH_2$(—OH), or a group represented by the following formula:

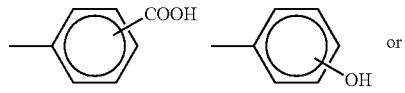

[Chemical Formula 3]

or

[Chemical Formula 4]

or a mixture thereof.

Examples of the ethylenically unsaturated monomer include, in addition to acrylic acid and methacrylic acid, compounds represented by the following compounds and a mixture thereof:

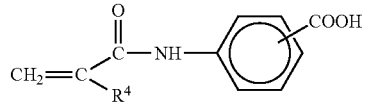

[Chemical Formula 5]

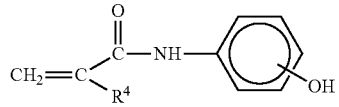

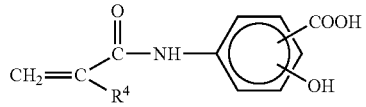

[Chemical Formula 6]

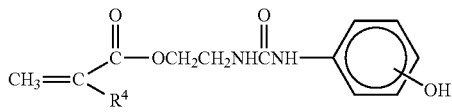

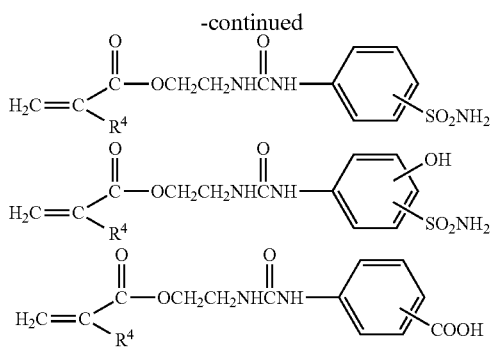

The monomer mixture can contain the other ethylenically unsaturated comonomer. Examples of the other ethylenically unsaturated comonomer include the following monomers:

acrylic acid esters such as methyl acrylate, ethyl acrylate, propyl acrylate, butyl acrylate, amyl acrylate, ethylhexyl acrylate, octyl acrylate, t-octyl acrylate, chloromethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, and tetrahydroacrylate;

aryl acrylates such as phenylacrylate and furfuryl acrylate;

methacrylic acid esters such as methyl methacrylate, ethyl methacrylate, propyl methacrylate, isopropyl methacrylate, allyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate;

aryl methacrylates such as phenyl methacrylate, cresyl methacrylate, and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide, and N-benzylacrylamide;

N-arylacrylamides such as N-phenylacrylamide, N-tolylacrylamide, N-nitrophenylacrylamide, N-naphthylacrylamide, and N-hydroxyphenylacrylamide;

N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide, and N,N-dicyclohexylacrylamide;

N,N-arylacrylamides such as N-methyl-N-phenylacrylamide, N-hydroxyethyl-N-methylacrylamide, and N-2-acetamidoethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide, and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide, and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide, and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate, and allyloxyethanol;

vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinyl naphthyl ether, and vinyl anthranyl ether;

vinyl esters such as vinyl butyrate, vinyl isobutyrate, vinyl trimethylacetate, vinyl diethylacetate, vinyl valerate, vinyl caproate, vinyl chloroacetate, vinyl methoxyacetate, vinyl butoxyacetate, vinyl phenylacetate, vinyl acetoacetate, vinyl lactate, vinyl-β-phenyl butyrate, vinyl cyclohexylcarboxylate, vinyl benzoate, vinyl salicylate, vinyl chlorobenzoate, vinyl tetrachlorobenzoate, and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene, and 4-fluoro-3-trifluoromethylstyrene;

crotonic acid esters such as butyl crotonate, hexyl crotonate, crotonic acid, and glycerin monocrotonate;

dialkyl itaconates such as dimethyl itaconate, diethyl itaconate and dibutyl itaconate;

dialkyls of maleic acid or fumaric acid, such as dimethyl maleate, and dibutyl fumarate;

maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide; and other nitrogen atom-containing monomers such as N-vinylpyrrolidone, N-vinylpyridine, acrylonitrile, and methacrylonitrile.

Of these other ethylenically unsaturated comonomers, for example, (meth)acrylic acid esters, (meth)acrylamides, maleimides and (meth)acrylonitriles are preferably used.

The content of the resin, which is soluble or dispersible in an alkali aqueous solution in the first image recording layer is within a range from 20 to 95% by mass based on the solid content of the layer. It is disadvantageous that the content of the resin, which is soluble or dispersible in an alkali aqueous solution, is less than 20% by mass, in view of chemical resistance. It is not preferred that the content is more than 95% by mass, in view of exposure speed. If necessary, two or more resins, which are soluble or dispersible in an alkali aqueous solution, may be used in combination.

<Second Image Recording Layer>

The second image recording layer constituting the lithographic printing plate precursor usable in the present invention contains an alkali-soluble resin. The alkali-soluble resin usable in the second image recording layer is preferably a resin having a carboxylic acid group or an acid anhydride group, and examples thereof include a copolymer obtained by polymerizing a monomer mixture containing either an unsaturated carboxylic acid or an unsaturated carboxylic anhydride, or both of an unsaturated carboxylic acid and an unsaturated carboxylic anhydride, polyurethane having a substituent containing an acidic hydrogen atom, and the like. Examples of the unsaturated carboxylic acid include acrylic acid, methacrylic acid, maleic acid, itaconic acid, and the like; and examples of the unsaturated carboxylic anhydride include maleic anhydride, itaconic anhydride, and the like. Examples of the copolymerizable ethylenically unsaturated monomer unit include the other ethylenically unsaturated comonomer.

Regarding the polyurethane having a substituent containing an acidic hydrogen atom, the acidic hydrogen atom can belong to an acidic functional group such as a carboxyl group, an —$SO_2NHCOO$— group, a —$CONHSO_2$— group, a —$CONHSO_2NH$— group or an —$NHCONHSO_2$— group, and an acidic hydrogen atom derived from a carboxyl group is particularly preferable.

The polyurethane having an acidic hydrogen atom can be synthesized, for example, by a process of reaction a diol having a carboxyl group and, optionally, other dials with diisocyanate.

Examples of the diol having a carboxyl group include 3,5-dihydroxybenzoic acid, 2,2-bis(hydroxymethyl)propionic acid, 2,2-bis(hydroxyethyl)propionic acid, 2,2-bis(3-hydroxypropylpropionic acid, 2,2-bis(hydroxymethyl)acetic acid, bis-(4-hydroxyphenyl)acetic acid, 4,4-bis-(4-hydroxyphenyl)pentanoic acid, tartaric acid, and the like. In particular, 2,2-bis(hydroxymethyl)propionic acid is more preferable in view of reactivity with isocyanate.

Examples of other diols include dimethylolpropane, polypropylene glycol, neopentyl glycol, 1,3-propane diol, polytetramethylene ether glycol, polyester polyol, polymer polyol, polycaprolactone polyol, polycarbonate diol, 1,4-butanediol, 1,5-pentadiol, 1,6-hexanediol, polybutadiene polyol, and the like.

Examples of the diisocyanate include 4,4'-diphenylmethane diisocyanate, xylylene diisocyanate, naphthylene-1,5-diisocyanate, tetramethylxylene diisocyanate, hexamethylene diisocyanate, toluene-2,4-diisocyanate, isophorone diisocyanate, hydrogenated xylylene diisocyanate, dicyclohexylmethane diisocyanate, norbornene diisocyanate, trimethylhexamethylene diisocyanate, dimer acid diisocyanate, and the like.

A molar ratio of diisocyanate to diol is preferably from 0.7:1 to 1.5:1. When an isocyanate group remains at a polymer end, a treatment with alcohols or amines enables synthesis in a state where an isocyanate group does not finally remain.

The copolymer containing either an unsaturated carboxylic acid or an unsaturated carboxylic anhydride, or both of an unsaturated carboxylic acid and an unsaturated carboxylic anhydride preferably has a weight average molecular weight within a range from 800 to 10,000. If the copolymer containing either an unsaturated carboxylic acid or an unsaturated carboxylic anhydride, or both of an unsaturated carboxylic acid and an unsaturated carboxylic anhydride preferably has a weight average molecular weight of less than 800, developer resistance may tend to be inferior because of weak image area obtained by formation of an image. On the other hand, if the weight average molecular weight of the copolymer is more than 10,000, sensitivity may tend to be inferior.

The weight average molecular weight of the polyurethane having a substituent containing an acidic hydrogen atom is preferably within a range from 2,000 to 100,000. If the weight average molecular weight of the polyurethane is less than 2,000, plate life may tend to be inferior because of weak image area obtained by formation of an image. On the other hand, if the weight average molecular weight of the polyurethane is more than 100,000, sensitivity may tend to be inferior.

The content of the copolymer containing either an unsaturated carboxylic acid or an unsaturated carboxylic anhydride, or both of an unsaturated carboxylic acid and an unsaturated carboxylic anhydride in the second image recording layer is preferably within a range from 10 to 100% by mass based on the solid content of the layer. It is not preferred that the content of the copolymer containing either an unsaturated carboxylic acid or an unsaturated carboxylic anhydride, or both of an unsaturated carboxylic acid and an unsaturated carboxylic anhydride is less than 10% by mass since it is advantageous in view of developer resistance.

On the other hand, the content of the copolymer containing either an unsaturated carboxylic acid or an unsaturated carboxylic anhydride, or both of an unsaturated carboxylic acid and an unsaturated carboxylic anhydride, or the polyurethane having a substituent containing an acidic hydrogen atom is preferably within a range from 2 to 90% by mass based on the solid content of the layer. It is disadvantage that the content of the polyurethane having a substituent containing an acidic hydrogen atom is less than 2% by mass, in view of developing speed. It is not preferred that the content is more than 90% by mass, in view of storage stability. If necessary, two or more kinds of polyurethanes having a substituent containing an acidic hydrogen atom may be used in combination. Two or more kinds of copolymers including an unsaturated carboxylic anhydride unit, copolymers including unsaturated carboxylic acid units, or polyurethanes having a substituent containing an acidic hydrogen atom may be used in combination.

<Photothermal Conversion Material>

The image recording layer can contain a photothermal conversion material. The photothermal conversion material means any material capable of converting electromagnetic waves into thermal energy and is a material having a maximum absorption wavelength within a near infrared or infrared range, for example, a material having a maximum absorption wavelength within a range from 760 to 1,200 nm. Examples of such substance include various pigments and dyes.

The pigments used in the present invention are commercially available pigments described, for example, in Color Index Handbook, "Latest Pigment Handbook" (edited by Nihon Pigment Technique Society, published in 1977), "Latest Pigment Application Technique" (published by CMC in 1986), and "Printing Ink Technique" (published by CMC in 1984). Applicable types of pigments include black, yellow, orange, brown, red, violet, blue and green pigments, fluorescent pigments and polymer-grafted pigments. For example, it is possible to use insoluble azo pigments, azo lake pigments, condensed azo pigments, chelated azo pigments, phthalocyanine pigments, anthraquinone pigments, perylene and perinone pigments, thiomindigo pigments, guinacridone pigments, dioxazine pigments, isoindolinone pigments, quinophthalone pigments, lake pigments, azine pigments, nitroso pigments, nitro pigments, natural pigments, fluorescent pigments, inorganic pigments and carbon black.

Of these pigments, carbon black is preferably used as a material which efficiently absorbs light in a near infrared or infrared range and is also economically excellent. As the carbon black, grafted carbon blacks having various functional groups, which are excellent in dispersibility, are commercially available and examples thereof include those described on page 167 of "The Carbon Black, Handbook, 3rd edition" (edited by the Carbon Black Society of Japan and issued in 1995) and those described in page 111 of "Characteristics, Optimum Blending and Applied Technique of Carbon Black" (edited by Technical Information Society in 1997), all of which are preferably used in the present invention.

These pigments may be used without a surface treatment, or may be used after subjected to a conventionally known surface treatment. Examples of a conventionally known surface treatment include a method of surface-coating a resin or a wax, a method of attaching a surfactant, and a method of binding a reactive substance (for example, silane coupling agent, epoxy compound, polyisocyanate etc.) to the surface of a pigment. The above-mentioned surface treating methods are described in "Property and Application of Metal Soap" (Saiwai Shobou), "Latest Pigment Application Technique" (published by CMC in 1986) and "Printing Ink Technique" (published by CMC in 1984). The particle size of these pigments is preferably within a range from 0.01 to 15 μm, and more preferably from 0.01 to 5 μm.

The dyes used in the present invention are conventionally known commercially available dyes disclosed, for example, in "Dye Handbook" (edited by the Association of Organic Synthesis Chemistry, published in 1970), "Handbook of Color Material Engineering" (edited by the Japan Society of Color Material, Asakura Shoten K. K., published in 1989), "Technologies and Markets of Industrial Dyes" (published by CMC in 1983), and "Chemical Handbook, Applied Chemistry Edition" (edited by The Chemical Society of Japan, Maruzen Shoten K. K., published in 1986). Specific examples of the dyes include azo dyes, azo dyes in the form of metal complex salts, pyrazolone azo dyes, anthraquinone dyes, phthalocyanine dyes, carbonium dyes, quinonimine dyes, methine dyes, cyanine dyes, indigo dyes, quinoline dyes, nitro-based dyes, xanthene-based dyes, thiazine-based dyes, azine dyes, and oxazine dyes.

As the dyes capable of efficiently absorbing near infrared ray or infrared ray, for example, it is possible to use dyes such as azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salts and metal thiolate complexes (for example, nickel thioate complex). Of these, cyanine dyes are preferable, and cyanine dyes represented by the general formula (I) of Japanese Unexamined Patent Publication (Kokai) No. 2001-305722 and compounds described in paragraphs [0096] to [0103] of Japanese Unexamined Patent Publication (Kokai) No. 2002-079772 can be exemplified.

The photothermal conversion material is particularly preferably a dye of the following formula:

[Chemical Formula 7]

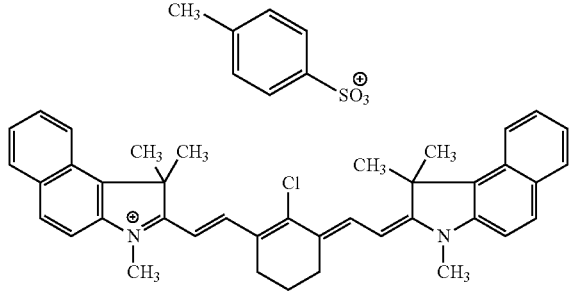

[Chemical Formula 8]

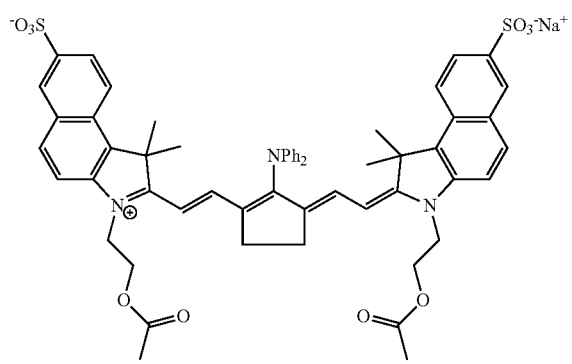

wherein Ph represents a phenyl group.

The photothermal conversion material can be added in the image recording layer in the amount within a range from 0.01 to 50% by mass, preferably from 0.1 to 25% by mass, and particularly preferably from 1 to 20% by mass, based on the total mass of the image recording layer. If the amount is less than 0.01% by mass, sensitivity may decrease. On the other hand, if the amount is more than 50% by mass, the non-image area may be contaminated during printing. These photothermal conversion materials may be used alone, or two or more kinds of them may be used in combination.

The lithographic printing plate precursor of the present invention is produced by sequentially coating solutions or dispersions prepared by dissolving or dispersing constituent components of an image recording layer in an organic solvent on a substrate, followed by drying to form the image recording layer on the substrate.

It is possible to use, as the organic solvent in which constituent components of the image recording layer are dissolved or dispersed, any of conventionally known organic solvents. Of these organic solvents, those having a boiling point within a range from 40° C. to 220° C., and particularly from 60° C. to 160° C. are selected in view of advantage upon drying.

Examples of the organic solvent include alcohols such as methyl alcohol, ethyl alcohol, n- or iso-propyl alcohol, n- or iso-butyl alcohol, and diacetone alcohol; ketones such as acetone, methyl ethyl ketone, methyl propyl ketone, methyl butyl ketone, methyl amyl ketone, methyl hexyl ketone, diethylketone, diisobutylketone, cyclohexanone, methylcyclohexanone, and acetylacetone; hydrocarbons such as hexane, cyclohexane, heptane, octane, nonane, decane, benzene, toluene, xylene, and methoxybenzene; acetic acid esters such as ethyl acetate, n- or iso-propyl acetate, n- or iso-butyl acetate, ethylbutyl acetate and hexyl acetate; halides such as methylene dichloride, ethylene dichloride, and monochloroebenzene; ethers such as isopropylether, n-butylether, dioxane, dimethyldioxane and tetrahydrofuran; polyhydric alcohols and derivatives thereof, such as ethylene glycol, ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate, ethylene glycol dimethyl ether, ethylene glycol diethyl ether, ethylene glycol dibutyl ether, methoxyethoxyethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, and 1-methoxy-2-propanol; and special solvents such as dimethyl sulfoxide, N,N-dimethylformamide, methyl lactate, and ethyl lactate. These organic solvents may be used alone, or in combination. It is suitable that the concentration of solid components in the solution or dispersion to be coated is adjusted within a range from 2 to 50% by mass. The term "solid components" as used herein mean components excluding the organic solvent.

It is possible to use, as the coating method of the solution or dispersion of constituent components of the image recording layer, for examples, a roll coating method, a dip coating method, an air knife coating method, a gravure coating method, a gravure offset coating method, a hopper coating method, a blade coating method, a wire doctor coating method, a spray coating method and a die coating method. The coating weight is preferably within a range from 10 ml/m² to 100 ml/m².

The solution or dispersion coated on the base support is usually dried by heated air. The drying temperature (the temperature of heated air) is preferably within a range from 30° C. to 220° C., and particularly preferably from 40° C. to 160° C. As the drying method, not only a method of maintaining the drying temperature at a given temperature during drying, but also a method of gradually raising the drying temperature can be carried out.

Preferable results may be sometimes obtained by dehumifying dry air. It is suitable to feed heated air to the surface to be coated at a rate of 0.1 m/seconds to 30 m/seconds, and particularly 0.5 m/seconds to 20 m/seconds.

Each coating weight of the image recording layer is independently within a range from about 0.1 to about 5 g/m² based on dry mass.

<Other Constituent Components of Image Recording Layer>

It is possible to optionally add known additive, for example, colorants (dyes, pigments), surfactants, plasticizers, stability improvers, development accelerators, development restrainers and lubricants (silicone powder, etc.) to the image recording layer of the lithographic printing plate precursor of the present invention.

Examples of preferable dye include basic oil-soluble dyes such as Crystal Violet, Malachite Green, Victoria Blue, Methylene Blue, Ethyl Violet and Rhodamine B. Examples of commercially available products include "Victoria Pure Blue BOH" (manufactured by HODOGAYA CHEMICAL CO., LTD.), "Oil Blue #603" (manufactured by ORIENT CHEMICAL INDUSTRIES CO., LTD.), "VPB-Naps (a naphthalenesulfonic acid salt of Victoria Pure Blue)" (manufactured by HODOGAYA CHEMICAL CO., LTD.) and "D11" (manufactured by PCAS). Examples of the pigment include Phthalocyanine Blue, Phthalocyanine Green, Dioxadine Violet and Quinacridone Red.

Examples of surfactants include fluorine-based surfactants, silicone-based surfactants, and the like.

Examples of plasticizers include diethyl phthalate, dibutyl phthalate, dioctyl phthalate, tributyl phosphate, trioctyl phosphate, tricresyl phosphate, tri(2-chloroethyl)phosphate, tributyl citrate, and the like.

It is possible to use, as the stabilizer, for example, phosphoric acid, phosphorous acid, oxalic acid, tartaric acid, malic acid, citric acid, dipicolinic acid, polyacrylic acid, benzenesulfonic acid, toluenesulfonic acid, and the like in combination.

Examples of other stability modifiers include known phenolic compounds, quinones, N-oxide compounds, amine-based compounds, sulfide group-containing compounds, nitro group-containing compounds and transition metal compounds. Specific examples thereof include hydroquinone, p-methoxyphenol, p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenimidazole, N-nitrosoenylhydroxyamine primary cerium salt, and the like.

Examples of the development accelerators include acid anhydrides, phenols and organic acids. The acid anhydrides are preferably cyclic anhydrides. Specifically, it is possible to use, as the cyclic anhydride, phthalic anhydride, tetrahydrophthalic anhydride, hexahydrophthalic anhydride, 3,6-endooxy-tetrahydrophthalic anhydride, tetrachlorophthalic anhydride, maleic anhydride, chloromaleic anhydride, α-phenyl maleic anhydride, succinic anhydride and pyromellitic anhydride described in the specification of U.S. Pat. No. 4,115,128. Examples of the noncyclic acid include acetic anhydrides. Examples of the phenols include bisphenol A, 2,2'-bishydroxysulfone, p-nitrophenol, p-ethoxyphenol, 2,4,4'trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane, and the like.

Examples of organic acids include sulfonic acids, sulfinic acids, alkylsulfuric acids, phosphonic acids, phosphate esters and carboxylic acids described in Japanese Unexamined Patent Publication (Kokai) No. 60-88942 and Japanese Unexamined Patent Publication (Kokai) No. 2-96755, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid, and the like.

The development restrainer is not particularly limited as long as it forms an interaction with the alkali-soluble resin, substantially decreases solubility in a developer of the alkali-soluble resin in the non-exposed area, and also lowers the interaction in the exposed area and thus it becomes soluble in the developer. In particular, a quaternary ammonium salt and a polyethylene glycol-based compound are preferably used. There are compounds which function as the development inhibitor among the infrared absorbers and colorants descried above, and they are also preferably exemplified. In the case of onium salts, o-quinonediazide compounds, aromatic sulfone compounds and aromatic sulfonic acid ester compounds, which are pyrolytic and are also in the state where they are not decomposed, substances capable of substantially decreasing solubility of the alkali-soluble resin are also exemplified.

The amount of these various additives varies depending on the purposes. Usually, the amount is preferably within a range from 0 to 30% by mass based on the solid components of the image recording layer.

In the image recording layer of the lithographic printing plate precursor of the present invention, if necessary, other alkali-soluble or dispersible resins can also be used in combination. Examples of the other alkali-soluble or dispersible resin include copolymers of alkali-soluble group-containing monomers such as acrylic acid, methacrylic acid, maleic acid, maleic anhydride, itaconic acid and itaconic anhydride with other monomers, polyester resins and acetal resins.

The lithographic printing plate precursor of the present invention may contain a matting agent in the image recording layer for the purpose of improving joined paper peelability and improving plate transport properties of an automatic plate feeding apparatus. In order to prevent the surface of a precursor from scratching, a protective layer may be provided on the image recording layer and the protective layer may contain the matting agent.

<Exposure and Development>

The infrared-sensitive or heat-sensitive lithographic printing plate precursor of the present invention can be used as a so-called computer-to-plate (CTP) plate capable of directly recording images on a plate, based on digital image information from a computer, using a laser.

As a light source of laser in the present invention, a high-output laser having a maximum intensity within a near infrared or infrared range is used most preferably. Examples of the high-output laser having a maximum intensity within a near infrared or infrared range include various lasers having a maximum intensity within a near infrared or infrared range of 760 to 1,200 nm, for example, semiconductor laser and YAG laser.

The lithographic printing plate precursor usable in the present invention is provided for an image forming method comprising recording images on the photosensitive layer using laser, followed by a development treatment and further removal of the non-image area using a wet method. That is, according to the image forming method of the present invention, images are formed through the steps of imagewise exposing the lithographic printing plate precursor usable in the present invention, and developing the exposed lithographic printing plate precursor and removing the exposed area, thereby to form the image area including an image recording layer, and the non-image area.

Examples of the developer used in a developing treatment include an alkali aqueous solution (basic aqueous solution). The pH of the alkali aqueous solution used in a positive-working lithographic printing plate precursor is preferably low (pH 12 or lower). Specifically, the pH is preferably from 7 to 12, more preferably from 8 to 12, and particularly preferably from 10 to 12.

Examples of the alkali agent used in the developer include inorganic alkali compounds such as potassium hydroxide, sodium hydroxide, lithium hydroxide, sodium, potassium or ammonium salts of secondary or tertiary phosphoric acid, sodium metasilicate, sodium carbonate and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine and ethylenediamine.

The content of the alkali agent in the developer is preferably within a range from 0.005 to 10% by mass, and particularly preferably from 0.05 to 5% by mass. The content of the alkali agent in the developer of less than 0.005% by mass is not preferable because the development may not be conducted sufficiently. The content of more than 10% by mass is not preferable because an adverse influence such as corrosion of the image area is exerted on development.

An organic solvent can also be added to the developer. Examples of the organic solvent, which can be added to the developer, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methylphenyl carbitol, n-amyl alcohol, methylamyl alcohol, xylene, methylene dichloride, ethylene dichloride, monochlorobenzene, and the like. When the organic solvent is added to the developer, the content of the organic solvent is preferably 20% by mass or less, and particularly preferably 10% by mass or less.

If necessary, it is also possible to add, in the developer, water soluble sulfites such as lithium sulfite, sodium sulfite, potassium sulfite and magnesium sulfite; hydroxyaromatic compounds such as alkali soluble pyrazolone compound, alkali soluble thiol compound, and methyl resorcin; water softeners such as polyphosphate and aminopolycarboxylic acids; various surfactants, for example, anionic, nonionic, cationic, amphoteric and fluorine-based surfactants such as sodium isopropylnaphthalenesulfonate, sodium n-butylnaphthalene sulfonate, sodium N-methyl-N-pentadecyl aminoacetate, and sodium lauryl sulfate; and various defoamers.

The temperature of the developer is preferably within a range from 15 to 40° C., and the dipping time is preferably within a range from 1 to 120 seconds. If necessary, a surface of a lithographic printing plate can be slightly rubbed during the development.

A treatment with the plate surface protecting composition of the present invention can be performed immediately after completion of the development, or can also be performed after treating with water or a rinsing solution. It is preferred to use an automatic processor or an automatic gum applicator so as to perform uniform treatment, although there is no particular limitation.

If necessary, the plate surface protecting composition enables the removal of excess solution using a doctor blade or a squeeze roll. Then, drying is performed in air using a hot-air dryer or an infrared dryer. Drying is preferably performed at a temperature of 20 to 120° C., and particularly preferably 40 to 80° C.

Examples of the negative-working lithographic printing plate precursor, which can be effectively treated with the plate surface protecting liquid composition of the present invention, include commercially available TN-News2 (manufactured by Kodak Japan Ltd.), TN-W (manufactured by Kodak Japan Ltd.), TCC-353 (manufactured by Kodak Japan Ltd.), HN-NV (manufactured by Fuji Photo Film Co., Ltd.), and the like.

EXAMPLES

The present invention will now be described in detail by way of examples, but the present invention is not limited to the scope of the following examples Production of Substrate An aluminum web was degreased with an aqueous sodium hydroxide solution and then subjected to an electrolytic roughening treatment in a 2% hydrochloric acid bath to obtain a grained plate having a center-line average roughness (Ra) of 0.5 µm. Then, the grained plate was subjected to an anodizing treatment in a 20% sulfuric acid bath at a current density of 2 A/dm$^2$ to form an oxide film (2.7 g/m$^2$), followed by washing with water and further drying to obtain an aluminum substrate. The substrate thus obtained was dipped in an aqueous polyvinylphosphonic acid (PVPA) solution at 60° C. for 10 seconds. Thus, a substrate for lithographic printing plate precursor was obtained.

Production of Positive-Working Lithographic Printing Plate Precursor

Preparation of Coating Solution for Bottom Layer

According to the formulation shown in Table I below, a coating solution for bottom layer was prepared.

TABLE I

| Coating solution for bottom layer | Mass (g) |
|---|---|
| Acrylonitrile/methacrylic acid/methacrylamide/styrene copolymer (50/10/25/15 (% by weight), average molecular weight of 50,000) | 5.33 |
| Infrared absorbing cyanine dye (A) | 0.63 |
| 4-Dimethylaminobenzoic acid | 0.19 |
| Colorant (Crystal Violet, manufactured by HODOGAYA CHEMICAL Co., Ltd.) | 0.08 |
| Silicone-based surfactant (DOW CORNING TORAY 8019 ADDITIVE, manufactured by Dow Corning Toray Co., Ltd.) | 0.03 |
| Methyl ethyl ketone | 61.00 |
| Propylene glycol monomethyl ether | 14.00 |
| γ-Butyrolactone | 9.40 |
| Water | 9.34 |

Infrared Absorbing Cyanine Dye (A)
[Chemical Formula 9]

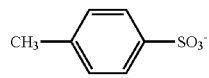
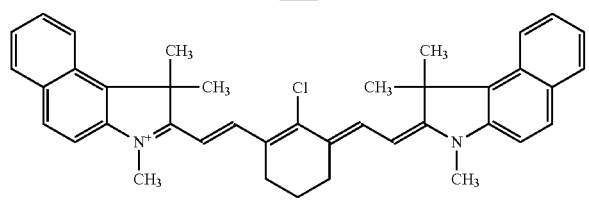

Preparation of Coating Solution for Top Layer

According to the formulation shown in Table II below, a coating solution for top layer was prepared.

TABLE II

| Coating solution for top layer | Mass (g) |
|---|---|
| Polyurethane resin | 38.50 |
| 4-Dimethylaminobenzoic acid | 1.50 |
| Colorant (Crystal Violet, manufactured by HODOGAYA CHEMICAL Co., Ltd.) | 0.03 |
| Fluorine-based surfactant (B) (30% MIBK solution) | 0.05 |
| Methyl ethyl ketone | 31.25 |
| Propylene glycol monomethyl ether | 31.25 |
| Propylene glycol monomethyl ether acetate | 7.42 |

Fluorine-Based Surfactant (B)
[Chemical Formula 10]

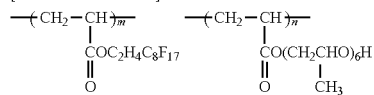

Synthesis of Polyurethane Resin

A 500 mL flask equipped with a stirrer and a reflux condenser was charged with 62.7 g of 4,4'-diphenylmethane diisocyanate, 14.5 g of toluylene-2,4-diisocyanate, 11.8 g of neopentyl glycol, 29.6 g of 2,2-bis(hydroxymethyl)propionic acid and 280 g of N,N-dimethylacetamide, followed by stirring. After adding 0.3 g of dibutyltin didodecanoate, the reaction solution was heated at 80° C. for 6 hours. After the reaction, the obtained solution was poured into 2.5 L of water. The precipitate was filtered, washed and then dried under reduced pressure at 60° C. for 24 hours. The thus obtained polyurethane resin exhibited a molecular weight as determined by GPC of 24,000 (polystyrene-equivalent) and an acid value of 105.

Using a roll coater, a coating solution for bottom layer was applied on a substrate and then dried at 135° C. for 45 seconds. The substrate was cooled to 35° C., a coating solution for top layer was applied on the bottom layer using a roll coater and then dried at 125° C. for 40 seconds. The plate thus obtained was slowly air cooled at 20° C. to 26° C. The coating amount of the bottom layer was 1.30 g/m² and the coating amount of the top layer was 0.60 g/m².

Preparation of Developing Solution

According to the formulation shown in Table III below, a developer (undiluted solution) was prepared.

TABLE III

| Developer for Positive-working Lithographic Printing Plate | |
|---|---|
| Developer (Undiluted solution) | |
| Deionized water | 780 ml |
| Monoethanolamine | 10 ml |
| Diethanolamine | 30 ml |
| PELEX NBL (aqueous 35% solution, manufactured by Kao Corporation) | 140 ml |
| Benzyl alcohol | 40 ml |
| pH of diluted developer (diluted with water in ratio of 1:4) | 11.5 |
| Conductivity of diluted developer (diluted with water in ratio of 1:4) | 12.0 mS/cm |

Preparation of Plate surface protecting Liquid (Gum1 to Gum13)

According to the formulation (% by mass) shown in Table IV, plate surface protecting liquids Gum1 to Gum13 were prepared.

TABLE IV

| Components | Gum1 | Gum2 | Gum3 | Gum4 | Gum5 | Gum6 | Gum7 |
|---|---|---|---|---|---|---|---|
| Water | 90.00 | 90.00 | 90.00 | 90.00 | 90.00 | 90.00 | 90.00 |
| Amycol No. 3 (Dextrin, manufactured by Nippon Starch Chemical Co., Ltd.) | 4.00 | 4.00 | 4.00 | 4.00 | 4.00 | 4.00 | 4.00 |
| AVEDEX 36 LAC-14 (Yellow Dextrin, manufactured by AVEBE) | 4.00 | 4.00 | 4.00 | 4.00 | 4.00 | 4.00 | 4.00 |

TABLE IV-continued

| Components | | | | | | | |
|---|---|---|---|---|---|---|---|
| Phosphoric acid | 0.40 | 0.40 | 0.40 | 0.40 | 0.40 | 0.40 | 0.40 |
| Ammonium dihydrogen phosphate | 0.80 | 0.80 | 0.80 | 0.80 | 0.80 | 0.80 | 0.80 |
| PELEX NBL (Sodium t-butylnaphthalene sulfonate, aqueous 35% solution, manufactured by Kao Corporation) | 0.80 | 0.80 | 0.80 | 0.80 | 0.80 | 0.80 | 0.80 |
| Compound A | 0.60 | — | — | — | — | — | — |
| Compound B | — | 0.60 | — | — | — | — | — |
| Compound C | — | — | 0.60 | — | — | — | — |
| Compound D | — | — | — | 0.60 | — | — | — |
| Compound E | — | — | — | — | 0.60 | — | — |
| Compound F | — | — | — | — | — | 0.60 | — |
| Compound G | — | — | — | — | — | — | 0.60 |
| Compound H | — | — | — | — | — | — | — |
| Compound I | — | — | — | — | — | — | — |
| BYK-306 (manufactured by BYK Japan KK) | — | — | — | — | — | — | — |

| Components | Gum8 | Gum9 | Gum10 | Gum11 | Gum12 | Gum13 |
|---|---|---|---|---|---|---|
| Water | 90.00 | 90.00 | 90.00 | 90.00 | 90.00 | 90.00 |
| Amycol No. 3 (Dextrin, manufactured by Nippon Starch Chemical Co., Ltd.) | 4.00 | 4.00 | 4.00 | 4.00 | 4.00 | 4.00 |
| AVEDEX 36 LAC-14 (Yellow Dextrin, manufactured by AVEBE) | 4.00 | 4.00 | 4.00 | 4.00 | 4.00 | 4.00 |
| Phosphoric acid | 0.40 | 0.40 | 0.40 | 0.40 | 0.40 | 0.40 |
| Ammonium dihydrogen phosphate | 0.80 | 0.80 | 0.80 | 0.80 | 0.80 | 0.80 |
| PELEX NBL (Sodium t-butylnaphthalene sulfonate, aqueous 35% solution, manufactured by Kao Corporation) | 0.80 | 0.80 | 0.80 | 0.80 | 0.80 | 0.80 |
| Compound A | — | — | 0.05 | 0.20 | 1.50 | — |
| Compound B | — | — | — | — | — | — |
| Compound C | — | — | — | — | — | — |
| Compound D | — | — | — | — | — | — |
| Compound E | — | — | — | — | — | — |
| Compound F | — | — | — | — | — | — |
| Compound G | — | — | — | — | — | — |
| Compound H | 0.60 | — | — | — | — | — |
| Compound I | — | 0.60 | — | — | — | — |
| BYK-306 (manufactured by BYK Japan KK) | — | — | — | — | — | 0.60 |

The compounds A to I used in these examples are shown below.

[Chemical Formula 11]

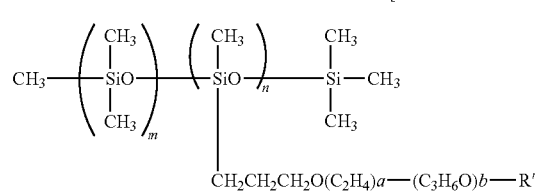

| Compounds | m | n | a | b | R' |
|---|---|---|---|---|---|
| Compound A | 320 | 40 | 27 | 26 | n-Bu |
| Compound B | 409 | 77 | 27 | 10 | n-Bu |
| Compound C | 755 | 99 | 12 | 0 | H |
| Compound D | 1010 | 120 | 22 | 8 | n-Bu |
| Compound E | 810 | 300 | 22 | 8 | n-Bu |
| Compound F | 770 | 80 | 150 | 140 | n-Bu |

[Chemical Formula 12]

Compound G

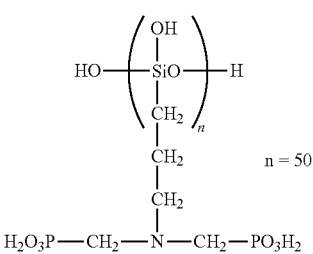

[Chemical Formula 13]

Compound H

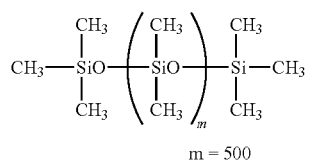

m = 500

[Chemical Formula 14]

Compound I

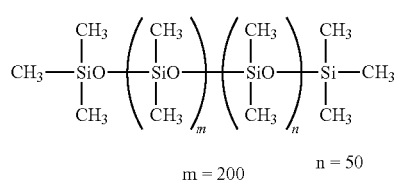

m = 200  n = 50

BYK-306 (manufactured by BYK Japan KK)
R-polyether $(CH_2)_y$—[Si(CH$_3$)$_2$—O]$_x$—Si(CH$_3$)$_2$—$(CH_2)_y$-polyether-R (wherein R: —OH, polyether: EO)

Structural Analysis of Compounds

Using AVANCE500 (500 MHz, manufactured by BROKER) and using CDC113 (containing TMS) as a solvent, structural analysis of compounds shown in Table 6 was performed by 1H,13C-Heteronuclear Multiple-Bond Correlation (HMBC) as a measurement method.

Using a thermal CTP setter PT-R4300 (manufactured by Dainippon Screen Mfg. Co., Ltd.), the positive-working lithographic printing plate precursor thus prepared was exposed at exposure energy of 150 mJ/cm$^2$. Thereafter, using a P-1310X processor (manufactured by Kodak Japan Ltd.), this lithographic printing plate was developed with the thus prepared diluted developer [developer for positive-working lithographic printing plate (undiluted solution):water=1:4] at 30° C. for 15 second, and then subjected to a gum coating treatment with plate surface protecting liquids Gum1 to Gum13.

Evaluation Procedure

[Inking Property at Beginning of Printing]

Using the above-mentioned positive-working lithographic printing plate, printing was carried out under the following conditions:

Printing press: R-201 (manufactured by Man Roland)
Ink: Space color fusion G magenta (manufactured by DIC Graphics Corporation)
Dampening-water: NA108W (manufactured by DIC Graphics Corporation) (1%)+IPA (1%)

Until a printed matter with a sufficient density is obtained, test printing was performed. The number of printed sheets until reaching a density of 1.5 (D19C: GretagMacbeth). Regarding the amount of scum, the symbol "G (Good)" indicates a small amount, whereas, the symbol "B (Bad)" indicates a large amount. The results are shown in Table V.

TABLE V

| | Plate surface protecting liquid | Number of sheets required to reach density of 1.5 | Scum state in a non-image area when reached density of 1.5 |
|---|---|---|---|
| Inventive Example 1 | Gum1 | 3 | G |
| Inventive Example 2 | Gum2 | 3 | G |
| Inventive Example 3 | Gum3 | 4 | G |
| Inventive Example 4 | Gum4 | 25 | G |
| Inventive Example 5 | Gum5 | 25 | G |
| Inventive Example 6 | Gum6 | 25 | G |
| Comparative Example 1 | Gum7 | >50 | G |
| Comparative Example 2 | Gum8 | >50 | G |
| Comparative Example 3 | Gum9 | >50 | G |
| Inventive Example 7 | Gum10 | 30 | G |
| Inventive Example 8 | Gum11 | 25 | G |
| Inventive Example 9 | Gum12 | 20 | G |
| Comparative Example 4 | Gum13 | >50 | G |

[Ink Clean-Up Property]

Under the same printing conditions as those of the inking property test at the beginning of printing, printing was carried out. After adhesion of an ink to the entire printing surface for about 30 minutes, printing was started. The number of printed sheets required until the ink of the non-image area is completely removed (ink clean up) is shown in the following table. At this times, the density of the non-image area was 0.03 (D19C: GretagMacbeth). The results are shown in Table VI.

TABLE VI

| | Plate surface protecting liquid | Number of sheets required until ink in non-image area is removed |
|---|---|---|
| Inventive Example 1 | Gum1 | 30 |
| Inventive Example 2 | Gum2 | 30 |
| Inventive Example 3 | Gum3 | 30 |
| Inventive Example 4 | Gum4 | 30 |
| Inventive Example 5 | Gum5 | 30 |
| Inventive Example 6 | Gum6 | 30 |
| Comparative Example 1 | Gum7 | 30 |
| Comparative Example 2 | Gum8 | 30 |
| Comparative Example 3 | Gum9 | 30 |
| Inventive Example 7 | Gum10 | 30 |
| Inventive Example 8 | Gum11 | 30 |
| Inventive Example 9 | Gum12 | 30 |
| Comparative Example 4 | Gum13 | 30 |

Lithographic Printing Plate Precursor

Using TN-News2 (manufactured by Kodak Japan Ltd.) as a negative-working lithographic printing plate precursor, a similar test was performed. Using a thermal CTP setter PT-R4300 (manufactured by Dainippon Screen Mfg. Co., Ltd.), TN-News2 was exposed at exposure energy of 80 mJ/cm$^2$. Thereafter, using a P-1310X processor (manufactured by Kodak Japan Ltd.), this lithographic printing plate was developed with a diluted developer [TN-D1 developer (manufactured by Kodak Japan Ltd.):water=1:3.5] at 30° C. for 12 seconds, and then subjected to a gum coating treatment with plate surface protecting liquids Gum14 to Gum20.

Preparation of Plate Surface Protecting Liquid (Gum14 to Gum20)

According to the formulation (% by mass) shown in Table VII, plate surface protecting liquids Gum14 to Gum20 were prepared.

TABLE VII

| Components | Gum14 | Gum15 | Gum16 | Gum17 | Gum18 | Gum19 | Gum20 |
|---|---|---|---|---|---|---|---|
| Water | 90.00 | 90.00 | 90.00 | 90.00 | 90.00 | 90.00 | 90.00 |
| Penon JE-66 (Dextrin, manufactured by Nippon Starch Chemical Co., Ltd.) | 5.00 | 5.00 | 5.00 | 5.00 | 5.00 | 5.00 | 5.00 |
| Amycol No. 3 (Dextrin, manufactured by Nippon Starch Chemical Co., Ltd.) | 3.50 | 3.50 | 3.50 | 3.50 | 3.50 | 3.50 | 3.50 |
| Gum arabic | 0.40 | 0.40 | 0.40 | 0.40 | 0.40 | 0.40 | 0.40 |
| Soya gum (extracted from soybean, manufactured by Fuji Oil Co., Ltd.) | 0.40 | 0.40 | 0.40 | 0.40 | 0.40 | 0.40 | 0.40 |
| Phosphoric acid | 0.10 | 0.10 | 0.10 | 0.10 | 0.10 | 0.10 | 0.10 |
| Citric acid | 0.20 | 0.20 | 0.20 | 0.20 | 0.20 | 0.20 | 0.20 |
| TWL-120 (Surfactant, manufactured by Kao Corporation) | 0.40 | 0.40 | 0.40 | 0.40 | 0.40 | 0.40 | 0.40 |
| Compound A | 0.60 | — | — | — | — | — | — |
| Compound B | — | 0.60 | — | — | — | — | — |
| Compound C | — | — | 0.60 | — | — | — | — |
| Compound G | — | — | — | 0.60 | — | — | — |
| Compound H | — | — | — | — | 0.60 | — | — |
| Compound I | — | — | — | — | — | 0.60 | — |
| BYK-306 (manufactured by BYK Japan KK) | — | — | — | — | — | — | 0.60 |

Under the same conditions as in the positive-working lithographic printing plate, inking property at the beginning of printing was evaluated. The results are shown in Table VIII.

TABLE VIII

| | Plate surface protecting liquid | Number of sheets required to reach density of 1.5 | Scum state in a non-image area when reached density of 1.5 |
|---|---|---|---|
| Inventive Example 10 | Gum14 | 3 | G |
| Inventive Example 11 | Gum15 | 5 | G |
| Inventive Example 12 | Gum16 | 7 | G |
| Comparative Example 5 | Gum17 | >50 | G |
| Comparative Example 6 | Gum18 | >50 | G |
| Comparative Example 7 | Gum19 | >50 | G |
| Comparative Example 8 | Gum20 | >50 | G |

| | Plate surface protecting liquid | Number of sheets required until ink in non-image area is removed |
|---|---|---|
| Inventive Example 10 | Gum14 | 30 |
| Inventive Example 11 | Gum15 | 30 |
| Inventive Example 12 | Gum16 | 30 |
| Comparative Example 5 | Gum17 | 30 |
| Comparative Example 6 | Gum18 | 30 |
| Comparative Example 7 | Gum19 | 30 |
| Comparative Example 8 | Gum20 | 30 |

The invention claimed is:

1. A method for treating a lithographic printing plate having image areas and non-images areas before it is mounted onto a lithographic printing press in order to accelerate inking in the image areas, which method comprises the step of:

treating the lithographic printing plate with a plate surface protecting liquid composition comprising a polysiloxane compound having a polyether chain in a side-chain, the lithographic printing plate having been formed by imagewise exposing a lithographic printing plate precursor, and developing the imagewise exposed lithographic printing plate precursor with an alkali developer.

2. The method according to claim 1, wherein the lithographic printing plate precursor is an infrared-sensitive lithographic printing plate precursor.

3. The treatment method according to claim 1, wherein the lithographic printing plate precursor is a positive-working infrared-sensitive lithographic printing plate precursor.

4. The treatment method according to claim 1, wherein the developer is an alkali solution having pH 12 or lower and is free of silicate.

5. The method according to claim 1, wherein the polysiloxane compound is present in the plate surface protecting liquid composition in the amount of 0.1 to 2.0% by mass based on the total mass of the plate surface protecting liquid composition.

6. The method according to claim 1, wherein the polysiloxane compound is represented by the following formula (I):

[Chemical Formula 1]

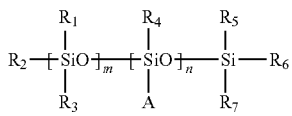

(I)

wherein $R_1, R_2, R_3, R_4, R_5, R_6$ and $R_7$ each independently is H or an alkyl group having 1 to 20 carbon atoms, A is represented by —R—$(C_2H_4O)_a(C_3H_6O)_b$—R', wherein R is an alkylene having 1 to 20 carbon atoms or an arylene having 6 to 14 carbon atoms, R' is H or an alkyl group having 1 to 4 carbon atoms, a is from 0 to 200, b is from 0 to 200 provided that there is no case of which a and b are simultaneously 0, and m and n are integers of 1 to 1,200.

7. The method according to claim 6, wherein $R_1$, $R_2$, $R_3$, $R_4$, $R_5$, $R_6$ and $R_7$ are selected from the group consisting of a methyl group, an ethyl group, a propyl group and a butyl group, a is from 0 to 100, and b is from 0 to 100, in the formula (I).

8. The method according to claim 6, wherein m is from 1 to 1,050 and n is from 1 to 200, in the formula (I).

9. The method according to claim 1, wherein the plate surface protecting liquid composition further comprises a water-soluble, film-forming polymer compound in an amount of at least 0.1% to 30% by mass, based on the total mass of the plate surface protecting liquid composition.

10. The method according to claim 1, wherein the plate surface protecting liquid composition further comprises a nonionic or anionic surfactant, or combination thereof, in an amount of at least 0.01% to 20% by mass, based on the total mass of the plate surface protecting liquid composition.

11. The method according to claim 1, wherein the lithographic printing plate precursor is ultraviolet light- or visible light-sensitive.

12. The method according to claim 1, wherein the lithographic printing plate precursor is a negative-working lithographic printing plate precursor.

* * * * *